(12) United States Patent
Sato

(10) Patent No.: US 9,784,767 B2
(45) Date of Patent: Oct. 10, 2017

(54) SHUNT RESISTANCE TYPE CURRENT SENSOR

(71) Applicant: YAZAKI CORPORATION, Minato-ku (JP)

(72) Inventor: Takashi Sato, Susono (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 14/994,240

(22) Filed: Jan. 13, 2016

(65) Prior Publication Data

US 2016/0124023 A1    May 5, 2016

Related U.S. Application Data

(63) Continuation of application No. PCT/JP2014/069463, filed on Jul. 23, 2014.

(30) Foreign Application Priority Data

Jul. 25, 2013   (JP) ................. 2013-154143

(51) Int. Cl.
*G01R 15/14*    (2006.01)
*G01R 31/36*    (2006.01)
(Continued)

(52) U.S. Cl.
CPC ....... *G01R 15/146* (2013.01); *G01R 19/0092* (2013.01); *G01R 31/3696* (2013.01); *G01R 1/203* (2013.01)

(58) Field of Classification Search
USPC ....... 324/126, 120, 105, 426, 601, 691, 713, 324/76.11; 320/107; 361/600, 624;
(Continued)

(56) References Cited

U.S. PATENT DOCUMENTS 7,561,448 B2    7/2009   Katayama et al.
8,040,088 B2   10/2011   Katayama et al.
(Continued)

FOREIGN PATENT DOCUMENTS

CN   10-1051796 A    10/2007
CN   10-2159955 A     8/2011
(Continued)

OTHER PUBLICATIONS

International Preliminary Report on Patentability dated Feb. 4, 2016, for the corresponding International application No. PCT/JP2014/069463.

(Continued)

*Primary Examiner* — Melissa Koval
*Assistant Examiner* — Nasima Monsur
(74) *Attorney, Agent, or Firm* — Morgan, Lewis & Bockius LLP

(57) ABSTRACT

A shunt resistance type current sensor includes a bus bar, a circuit board, voltage detection terminals and a voltage detector for detecting a magnitude of voltage applied to the bus bar. The bus bar is constituted of a through hole to be connected to a battery post, a through hole to be connected to a stud bolt for fixing a wire harness, and a shunt resistance part located between the through hole for the battery post and the through hole for the wire harness. The bus bar is configured so that an area including the through hole and an area including the through hole are formed in a stepped manner via a bent part.

10 Claims, 4 Drawing Sheets

(51) Int. Cl.
*G01R 19/00* (2006.01)
*G01R 1/20* (2006.01)

(58) Field of Classification Search
USPC .......................................................... 702/64
See application file for complete search history.

(56) References Cited

U.S. PATENT DOCUMENTS

| | | | |
|---|---|---|---|
| 8,427,133 | B2 | 4/2013 | Ito et al. |
| 8,461,824 | B2 | 6/2013 | Ausserlechner |
| 8,779,757 | B2 | 7/2014 | Ausserlechner |
| 9,151,782 | B2 | 10/2015 | Lint et al. |
| 9,366,700 | B2 | 6/2016 | Ausserlechner |
| 2007/0246636 | A1 | 10/2007 | Katayama et al. |
| 2009/0243524 | A1 | 10/2009 | Katayama et al. |
| 2010/0066351 | A1* | 3/2010 | Condamin ............ G01R 1/203 324/126 |
| 2010/0194381 | A1 | 8/2010 | Ito et al. |
| 2011/0025304 | A1 | 2/2011 | Lint et al. |
| 2011/0025305 | A1 | 2/2011 | Lint et al. |
| 2011/0050260 | A1* | 3/2011 | Teramoto ........... G01R 31/3696 324/705 |
| 2011/0062945 | A1 | 3/2011 | Condamin et al. |
| 2011/0096495 | A1* | 4/2011 | Heise ................... H05K 1/0263 361/688 |
| 2011/0148561 | A1 | 6/2011 | Lint et al. |
| 2011/0187346 | A1* | 8/2011 | Teramoto ............... G01R 19/00 324/76.11 |
| 2011/0298454 | A1 | 12/2011 | Ausserlechner |
| 2013/0040177 | A1 | 2/2013 | Hashio et al. |
| 2013/0252050 | A1 | 9/2013 | Uematsu |
| 2013/0300407 | A1 | 11/2013 | Ausserlechner |
| 2014/0266178 | A1 | 9/2014 | Ausserlechner |
| 2014/0320150 | A1 | 10/2014 | Sato |
| 2016/0097794 | A1 | 4/2016 | Lint et al. |

FOREIGN PATENT DOCUMENTS

| | | |
|---|---|---|
| CN | 10-2331518 A | 1/2012 |
| CN | 10-2763243 A | 10/2012 |
| CN | 10-2770772 A | 11/2012 |
| JP | UM-S58-088161 A | 6/1983 |
| JP | H04-083175 A | 3/1992 |
| JP | 08-194016 A | 7/1996 |
| JP | 2011-69807 | 4/2011 |
| JP | 2011-123080 A | 6/2011 |
| JP | 2011-222188 | 11/2011 |
| JP | 2012-078328 A | 4/2012 |
| JP | 2012-109098 A | 6/2012 |
| JP | 2013-096881 A | 5/2013 |
| JP | 2013-124859 A | 6/2013 |

OTHER PUBLICATIONS

International Search Report dated Sep. 9, 2014, for International application No. PCT/JP2014/069463.
Japanese Office Action issued in Japanese Patent Application No. 2013-154143 dated Oct. 17, 2016.
Office Action dated Apr. 4, 2017 in corresponding Japanese Patent Application No. 2013-154143 with English translation of same.
Chinese Office Action dated May 17, 2017 in corresponding Chinese Patent Application No. 201480042109.X with English translation.

* cited by examiner

SHUNT RESISTANCE TYPE CURRENT SENSOR

CROSS REFERENCE TO RELATED APPLICATIONS

This application is a continuation of PCT application No. PCT/JP2014/069463, which was filed on Jul. 23, 2014 based on Japanese Patent Application (No. P2013-154143) filed on Jul. 25, 2013, the contents of which are incorporated herein by reference.

BACKGROUND OF THE INVENTION

1. Field of the Invention

The present invention relates to a shunt resistance type current sensor.

2. Description of the Related Art

There has been proposed a shunt resistance type current sensor in which current to be measured flows into a shunt resistor having a known resistance value in order to detect a pulse current, a large AC current or the like, and a voltage drop generated across the shunt resistor is detected, thereby measuring a magnitude of the current to be measured. For example, in a vehicle such as an automobile, a metal piece called a bus bar is sometimes used for power distribution, and a part of the bus bar corresponding to a current path is utilized as a shunt resistor. A circuit board is disposed on the bus bar. In order to detect a magnitude of the current to be measured flowing through the bus bar, the circuit board mounts a voltage detection IC, and so on for detecting a magnitude of voltage applied to the shunt resistor.

A patent literature 1 to be described below discloses a current sensor in which a bus bar is provided with a flat part, a circuit board is mounted on the flat part, and a current flowing in the bus bar is obtained based on a voltage drop in the bus bar and a known resistance value. This bus bar is provided at one end thereof with a connection part to be connected to a battery post and at the other end thereof with a connection part to be connected to a wire harness via a stud bolt. The bus bar is disposed on an upper surface of a battery at which the battery post exists.

The patent literature 1 is JP-A-2012-78328.

SUMMARY OF THE INVENTION

However, according to the technique disclosed in the patent literature 1, as the stud bolt exists in a distant position from the upper surface of the battery, there arises a problem that a distance to a bonnet from the battery becomes short. Thus, as a space between the bonnet and the stud bolt is small, an amount of deformation of the bonnet may not be secured to be large with respect to load input.

The invention is made in view of the aforesaid circumstances and an object thereof is to provide a shunt resistance type current sensor which can lower a relative attachment position of a stud bolt disposed at a bus bar.

In order to solve the aforesaid problem, the shunt resistance type current sensor according to the invention has the following features (1) to (5).

(1) A shunt resistance type current sensor, includes:

a bus bar which includes a first connection part to be connected to a battery post, a second connection part to be connected to a stud bolt for fixing a wire harness, and a shunt resistance part which is located between the first connection part and the second connection part and acts as a path of current to be measured;

a circuit board which is disposed so as to oppose the bus bar;

a pair of terminals which electrically connect the bus bar and the circuit board; and a voltage detector which is mounted on the circuit board and detects a magnitude of voltage applied between the pair of terminals in order to detect an amount of current to be measured flowing through the bus bar, wherein the bus bar is configured so that an area including the second connection part and an area including the first connection part are formed in a stepped manner via a bent part, and the second connection part is set at a position lower than the first connection part.

(2) The shunt resistance type current sensor having the configuration of (1), wherein the bent part is set between the shunt resistance part and the second connection part, and the circuit board is disposed so as to oppose a lower surface side of the shunt resistance part.

(3) The shunt resistance type current sensor having the configuration of (2), further includes:

an exterior case which is formed in the bus bar by insert molding so as to have a concave space for assembling the circuit board to the bus bar, and a sealed part which is formed by filling mold material within the concave space of the exterior case, wherein the exterior case is set so that the concave space faces downward.

Further, in this invention:

(4) The shunt resistance type current sensor having the configuration of (1), wherein the bent part is set between the first connection part and the shunt resistance part, and the circuit board is disposed so as to oppose an upper surface side of the shunt resistance part.

(5) The shunt resistance type current sensor having the configuration of (4), further includes:

an exterior case which is formed in the bus bar by insert molding so as to have a concave space for assembling the circuit board to the bus bar, and a sealed part which is formed by filling mold material within the concave space of the exterior case, wherein the exterior case is set so that the concave space faces upward.

According to the invention, as the bent part is provided at the bus bar, the second connection part can be set at a position lower than the first connection part. By doing so, the stud bolt to be connected to the second connection part can be relatively lowered as compared with a case that the bus bar is set in a flat shape entirely. Thus, a required space can be secured between a bonnet above a battery and the stud bolt. As a result, as an amount of deformation of the bonnet can be secured to be large with respect to load input, impact absorption characteristics with respect to load can be improved.

BRIEF DESCRIPTION OF THE DRAWINGS

FIG. 7A shows a state including an exterior case, and FIG. 7B shows a state excluding the exterior case.

DETAILED DESCRIPTION OF THE EXEMPLARY EMBODIMENTS

First Embodiment

Figure 1:
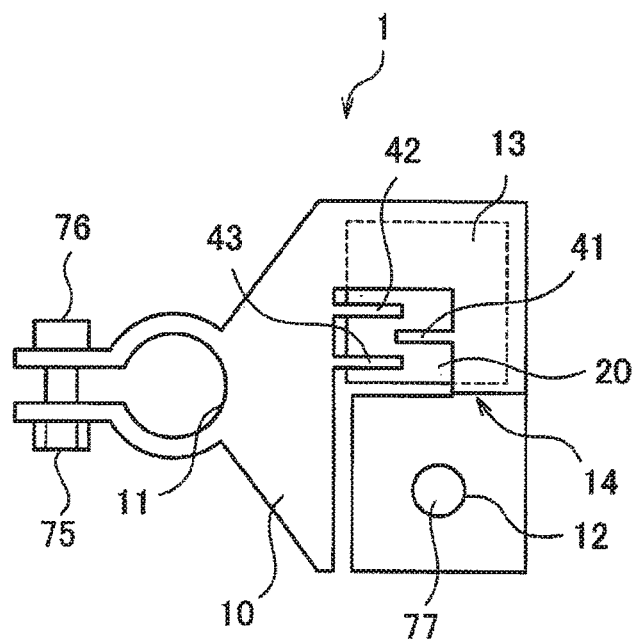
FIG. 1 is a top view schematically showing a shunt resistance type current sensor according to a first embodiment.
Figure 2:
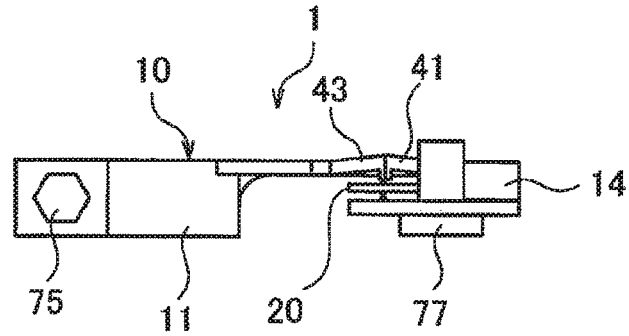
FIG. 2 is a side view schematically showing the shunt resistance type current sensor according to the first embodiment.
Figure 3:
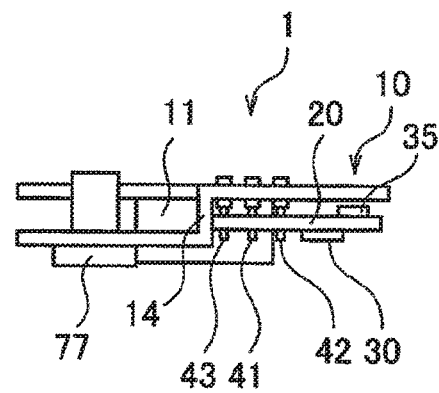
FIG. 3 is a side view schematically showing the shunt resistance type current sensor according to the first embodiment.

FIG. 1 is a top view schematically showing a shunt resistance type current sensor 1 according to this embodiment. FIG. 2 is a side view schematically showing the shunt resistance type current sensor 1 according to the embodiment and shows a state of the shunt resistance type current sensor 1 shown in FIG. 1 seen from a lower side with respect to the sheet. FIG. 3 is a side view schematically showing the shunt resistance type current sensor 1 according to the embodiment and shows a state of the shunt resistance type current sensor 1 shown in FIG. 1 seen from the right direction with respect to the sheet. The shunt resistance type current sensor 1 according to the embodiment is used as a battery terminal and mainly configured of a bus bar 10 and a circuit board 20.

The bus bar 10 is a conductive member of a substantially flat plate shape and constituted of, for example, copper-manganese alloy, copper-nickel-alloy or the like. A shunt resistance part 13 is set at a part of the bus bar 10. The bus bar is formed to flow current to be measured through the shunt resistance part 13 when current flows in the bus bar 10. The bus bar 10 is formed to have a desired shape by press-molding a flat plate-shaped steel.

The bus bar 10 is formed in, for example, substantially U-shaped when seen from the above. Through holes 11 and 12 are formed at both end portions of the bus bar, respectively. The one through hole 11 is a hole acting as a first connection part to be connected to a battery post. A fixing bolt 76 and a nut 75 are attachable to a periphery of this hole. The other through hole 12 is a hole acting as a second connection part to which a stud bolt for fixing a wire harness is connected. The shunt resistance part 13 is positioned between the both through holes 11 and 12.

As one feature of this embodiment, the bus bar 10 is formed so that an area including the through hole 12 for the wire harness and an area including the through hole 11 for the battery post are formed in a stepped manner via a crank-shaped bent part 14. In this embodiment, the bent part 14 is set between the shunt resistance part 13 and the through hole 12 for the wire harness. Due to the presence of this bent part 14, the through hole 12 for the wire harness is set at a position lower than the through hole 11 for the battery post. Incidentally, relative relation of height between the through hole 12 for the wire harness and the through hole 11 for the battery post is determined with reference to a state that the bus bar 10 is connected to the battery post.

The shunt resistance type current sensor 1 includes a pair of voltage detection terminals 41 and 42 corresponding to positive and negative electrodes, respectively. Each of the voltage detection terminals 41 and 42 electrically connects between the circuit board 20 and the bus bar 10, and also holds the circuit board 20 with respect to the bus bar 10, in a case that the shunt resistance type current sensor 1 is used as the battery terminal and attached to the battery post on the negative electrode side of a battery, the one voltage detection terminal 41 corresponds to a voltage detection terminal of the positive electrode side and the other voltage detection terminal 42 corresponds to a voltage detection terminal of the negative electrode side. The voltage detection terminals 41 and 42 are provided at positions corresponding to both ends of the shunt resistance part 13, respectively.

Each of the voltage detection terminals 41 and 42 is configured as a belt-shaped extending piece extended from a corresponding edge part of the bus bar 10. The voltage detection terminals 41 and 42 are alternatively extended in opposite directions from the respective edge parts so as to oppose to each other and be juxtaposed in parallel. The voltage detection terminals 41 and 42 are formed integrally with the bus bar 10 in such a manner of being formed simultaneously with the bus bar 10 by the press work.

Each of the voltage detection terminals 41 and 42 is configured in substantially L-shaped. That is, each of these voltage detection terminals is configured in a manner that the corresponding edge part of the bus bar 10 is extended and then bent to the circuit board 20 side located below. A tip side portion to the bent position is extended linearly and a tip area thereof penetrates the circuit board 20 (see FIG. 2).

Specifically, each of the voltage detection terminals 41 and 42 is configured of a base part connected to the bus bar 10 and a tip part located at a tip side of the base part. The base part is set to have a plate thickness same as that of the bus bar 10 and is bent in the middle thereof to the circuit board 20 side. On the other hand, the tip part is set to have a plate thickness smaller than that of the bus bar and have a width smaller than that of the bus bar. The tip part penetrates the circuit board 20. The tip part is formed by, for example, a thickness reducing work for reducing the plate thickness thereof. This thickness reducing work is a preprocessing for realizing the penetration through the circuit board 20 by a small hole and is performed prior to the bending work at the base part.

In this respect, as an inner diameter of a through hole formed at the circuit board 20 matches to an outer diameter of the tip part, the base part cannot enter into this through hole. Thus, between the bus bar 10 and the circuit board 20, there is a gap corresponding to a length from the bent position to the tip part. In this manner, the voltage detection terminals 41 and 42 hold the circuit board 20 in a manner of separating from the bus bar 10.

The shunt resistance type current sensor 1 further includes a ground terminal 43. The ground terminal 43 electrically connects between the bus bar 10 and the circuit board 20, and further, like the pair of voltage detection terminals 41 and 42, holds the circuit board 20 with respect to the bus bar 10. This ground terminal 43 is disposed outside the pair of voltage detection terminals 41 and 42 with respect to a current path of current to be measured flowing through the bus bar 10. In other words, the ground terminal 43 is disposed outside than the shunt resistance part 13. In this embodiment, the ground terminal 43 is provided between the other voltage detection terminal 42 and the through hole 11 for the battery post.

The ground terminal 43 is configured as a belt-shaped extending piece extended from an edge part of the bus bar 10 in a manner that the edge part of the bus bar 10 is extended and then bent to the circuit board 20 side, and a tip area thereof penetrates the circuit board 20. As concrete configuration of the ground terminal 43 is substantially same as that of each of the voltage detection terminals 41 and 42, detailed explanation thereof will be omitted.

The circuit board 20 is disposed so as to oppose the bus bar 10 with a predetermined space therebetween. In this embodiment, the circuit board is disposed to oppose a lower surface side of the shunt resistance part 13. A pair of circuit patterns (not shown) are formed on the circuit board 20. Respective one end portions of the pair of circuit patterns are connected to the voltage detection terminals 41 and 42 each penetrating the circuit board 20. Respective the other end portions of the pair of circuit patterns are connected to a voltage detection IC 30 described later. Further, a ground pattern (not shown) is formed on the circuit board 20. One end portion of the ground pattern is connected to the ground terminal 43 penetrating the circuit board 20, and the other end thereof is connected to the voltage detection IC 30. Each of the connection between the respective voltage detection terminals 41, 42 and the circuit patterns and the connection between the ground terminal 43 and the ground pattern is performed, for example, by soldering.

The voltage detection IC 30 is mounted on the circuit board 20 and connected to the circuit patterns and the ground pattern each formed on the circuit board 20. A microcomputer mainly configured of a CPU, an ROM, an RAM and an I/O interface can be used as the voltage detection IC 30. In order to detect an amount of current to be measured flowing through the bus bar 10, the voltage detection IC 30 (voltage detector) detects voltage applied to the circuit board 20 via the pair of voltage detection terminals 41, 42. That is, the voltage detection IC 30 detects a voltage drop generated across the shunt resistance part 13 of the bus bar 10 and then detects an amount of current to be measured flowing through the bus bar 10 based on the voltage drop.

The voltage detection IC 30 performs correction according to a detection result of a temperature sensor 35 described later. Specifically, the voltage detection IC 30 corrects a resistance value of the shunt resistance part 13 according to the temperature detection result so as not to detect an erroneous current value influenced by a change of the resistance value due to temperature change.

The temperature sensor 35 is provided on one surface of the circuit board 20 opposing the shunt resistance part 13 of the bus bar 10. In this embodiment, the temperature sensor is provided on the one surface of the circuit board 20 opposite the other surface thereof mounting the voltage detection IC 30. The temperature sensor 35 (temperature detector) detects a temperature of the bus bar 10 (shunt resistance part 13) opposing itself. A temperature detected by the temperature sensor 35 is outputted to the voltage detection IC.

Incidentally, in order to improve a detection accuracy of the temperature sensor 35, preferably a distance between the circuit board 20 and the bus bar 10 is short. In view of this, each of the voltage detection terminals 41, 42 and the ground terminal 43 is subjected to a bending work of being bent upward at a root portion thereof continued to the bus bar 10.

Figure 4:
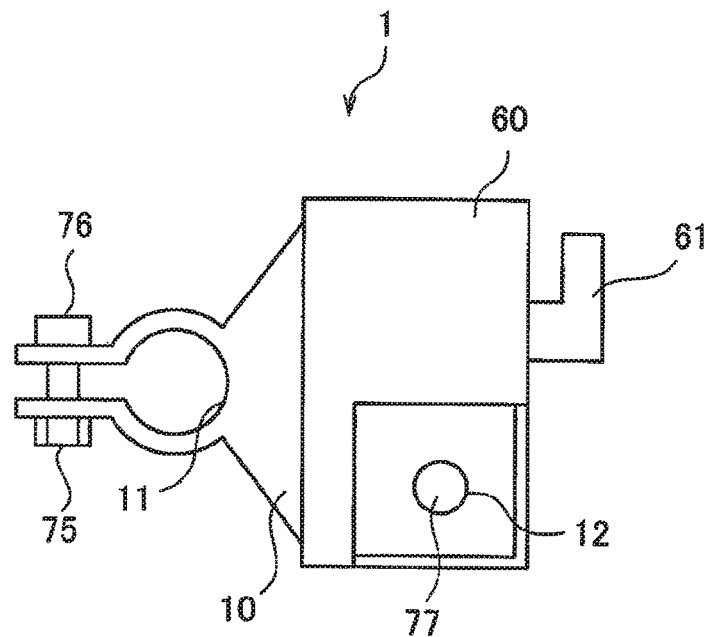
FIG. 4 is an explanatory diagram of the shunt resistance type current sensor including an exterior case.
Figure 5:
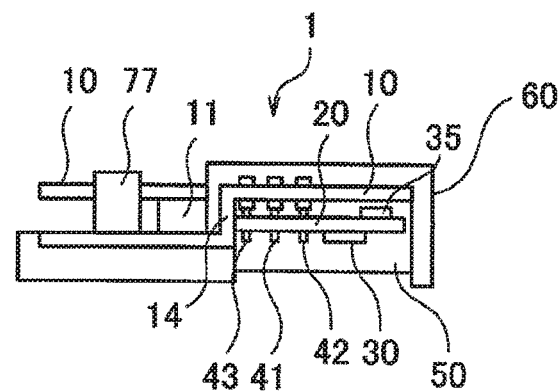
FIG. 5 is an explanatory diagram of the shunt resistance type current sensor including the exterior case.

FIGS. 4 and 5 are explanatory diagrams of the shunt resistance type current sensor 1 including an exterior case 60. The shunt resistance type current sensor 1 further includes the exterior case 60. The exterior case 60 is formed to cover a required portion of the bus bar 10. As shown in FIG. 5, the exterior case 60 has a concave space for assembling the circuit board 20 to the bus bar 10. In this embodiment, the concave space is set so as to face downward.

The exterior case 60 is formed in the bus bar 10 by insert molding. Thus, after forming the exterior case 60, the circuit board 20 is connected to the voltage detection terminals 41, 42 and the ground terminal 43, and then the circuit board 20 is disposed within the concave space. Mold material is filled within the concave space of the exterior case 60 and thus a sealed part 50 is formed. Protection of elements, etc. mounted on the circuit board 20 can be achieved by this sealed part 50. A connector 61 to be connected to the circuit board 20 can be attached to the exterior case 60, and thus the voltage detection IC 30 can communicate with an external device.

Figure 6:
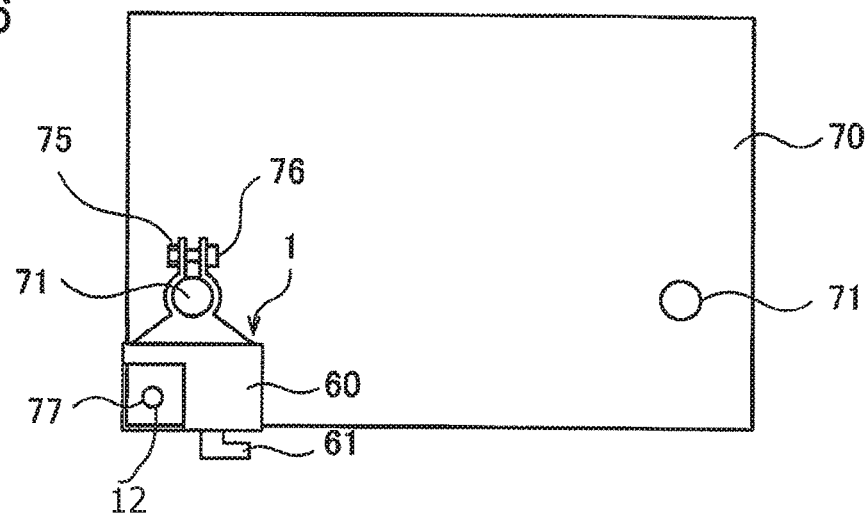
FIG. 6 is an explanatory diagram schematically showing a using state of the shunt resistance type current sensor.
Figure 7A:
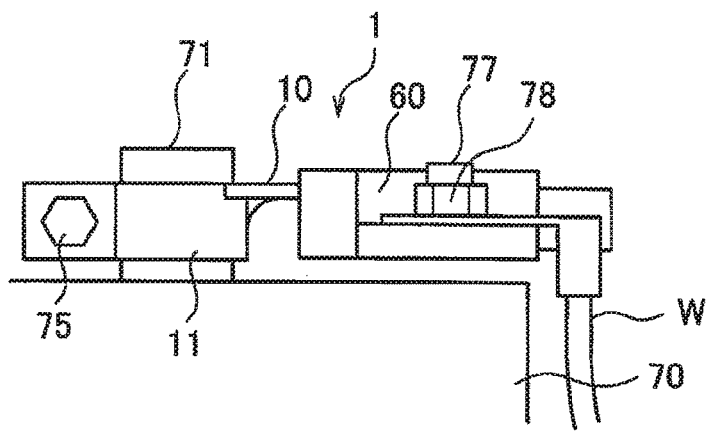
FIGS. 7A and 7B illustrate explanatory diagrams schematically showing using states of the shunt resistance type current sensor.
Figure 7B:
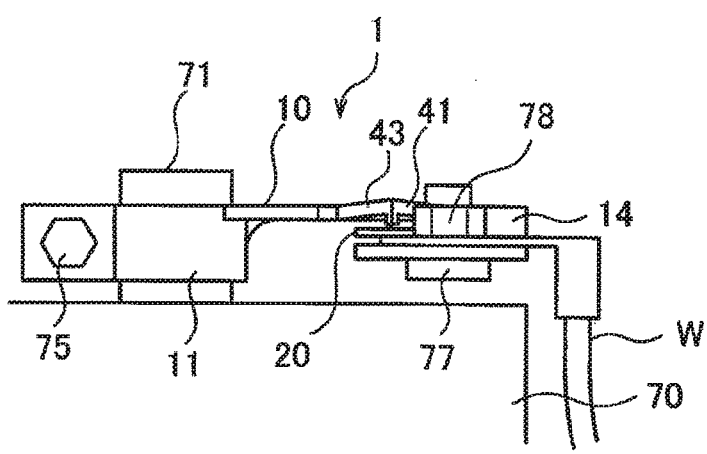

FIGS. 6 and 7 are explanatory diagrams schematically showing using states of the shunt resistance type current sensor 1 according to the embodiment. In FIGS. 7A and 7B, FIG. 7A shows a state including the exterior case 60, and FIG. 7B shows a state excluding the exterior case 60. The bus bar 10 of the shunt resistance type current sensor 1 according to the embodiment is used as the battery terminal usable for a battery 70. For example, the one through hole 11 of the bus bar 10 is connected to the negative electrode side of a battery post 71 using a bolt 76 and a nut 75. Further, a stud bolt 77 is penetrated through the other through hole 12, and then the wire harness W is fixed to the stud bolt 77 using a nut 78. In this case, the stud bolt 77 is penetrated through the through hole 12 of the bus bar 10 upward from below.

In this manner, according to the embodiment, the shunt resistance type current sensor 1 includes the bus bar 10, the circuit board 20 disposed so as to oppose the bus bar 10, the voltage detection terminals 41, 42 and the ground terminal 43 which eclectically connect between the bus bar 10 and the circuit board 20, and the voltage detection IC 30 which is mounted on the circuit board 20 and detects a magnitude of voltage applied to the bus bar 10 in order to detect an amount of current to be measured flowing through the bus bar 10. In this respect, the bus bar 10 is configured of the through hole 11 to be connected to the battery post 71, the through hole 12 to be connected to the stud bolt 77 for fixing the wire harness W, and the shunt resistance part 13 located between the through hole 11 for the battery post 71 and the through hole 12 for the wire harness W and acts as a path for current to be measured. The bus bar 10 is configured so that the area including the through hole 12 for the wire harness W and the area including the through hole 11 for the battery post 71 are formed in the stepped manner via the crank-shaped bent part 14, and that the through hole 12 for the wire harness W is set at a position lower than the through hole 11 for the battery post 71.

As the bus bar 10 constituting the shunt resistance type current sensor 1 is provided with the bent part 14, the through hole 12 for the wire harness W can be set at the position lower than the through hole 11 for the battery post 71. By doing so, the stud bolt 77 can be relatively lowered to the battery 70 side as compared with a case that the bus bar 10 is set in a flat shape entirely. Thus, a required space can be secured between a bonnet above the battery and the stud bolt 77. As a result, as an amount of deformation of the bonnet can be secured to be large with respect to load input, impact absorption characteristics with respect to load can be improved.

Further, in this embodiment, the bent part 14 is set between the shunt resistance part 13 and the through hole 12 for the wire harness W, and the circuit board 20 is disposed so as to oppose the lower surface side of the shunt resistance part 13.

In order to suppress degradation of detection accuracy due to noise radiation from the circuit board 20 and disturbance noise, the circuit board 20 is disposed desirably between the battery 70 and the bus bar 10. In this respect, according to the embodiment, as the bent part 14 is positioned at an end of the shunt resistance part 13, sufficient disposal space for disposing the circuit board 20 can be secured on the lower surface side of the shunt resistance part 13. As a result, the circuit board 20 can be disposed on the lower surface side of the shunt resistance part 13 while avoiding interference between the bent part 14 and the circuit board 20.

Further, in this embodiment, the shunt resistance type current sensor 1 further includes the exterior case 60 which is formed in the bus bar 10 by the insert molding so as to have the concave space for assembling the circuit board 20 to the bus bar 10, and the sealed part 50 which is formed by filling the mold material within the concave space of the exterior case 60. The exterior case 60 is set so that the concave space faces downward.

According to such the configuration, the exterior case 60 can protect the circuit board 20. Further, as the exterior case 60 is set in a manner that the concave space housing the circuit board 20 therein faces downward, entering of liquid such as water can be suppressed together with the sealed part 50.

Second Embodiment

Figure 8:
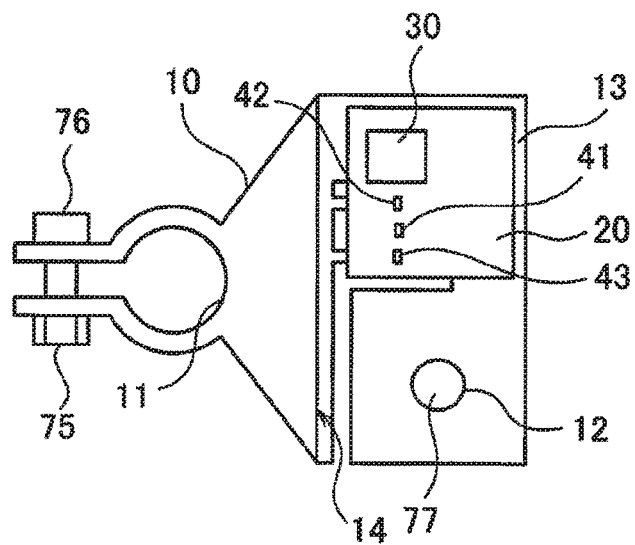
FIG. 8 is a top view schematically showing a shunt resistance type current sensor according to a second embodiment.
Figure 9:
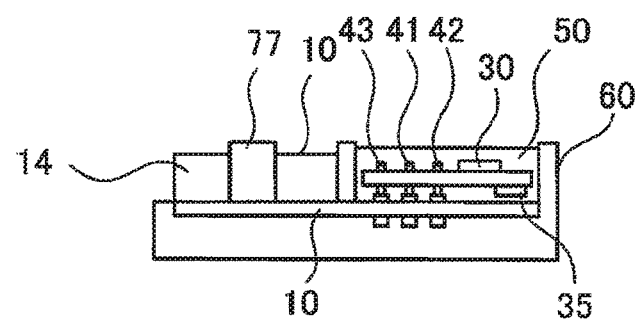
FIG. 9 is an explanatory diagram of the shunt resistance type current sensor including an exterior case.

Hereinafter a shunt resistance type current sensor 1 according to the second embodiment will be explained. The shunt resistance type current sensor 1 according to the second embodiment differs from the first embodiment in the setting position of the bent part 14. FIG. 8 is a top view schematically showing the shunt resistance type current sensor 1 according to this embodiment. FIG. 9 is an explanatory diagram of the shunt resistance type current sensor 1 including an exterior case 60.

As one feature of this embodiment, the bent part 14 of the bus bar 10 is set between the shunt resistance part 13 and the through hole 11 for the battery post. Like the first embodiment, due to the presence of the bent part 14, the through hole 12 for the wire harness is set at a position lower than the through hole 11 for the battery post.

On the other hand, the circuit board 20 is disposed so as to oppose the bus bar 10 with a predetermined space therebetween. In this embodiment, the circuit board 20 is disposed to oppose an upper surface side of the shunt resistance part 13. Like the first embodiment, the circuit board 20 can be disposed to oppose the lower surface side of the shunt resistance part 13. However, in this case, as a height from the circuit board 20 to the uppermost surface of the bus bar 10 becomes large, this disposal is preferable in order to meet a demand for reduction in thickness.

Each of voltage detection terminals 41, 42 and a ground terminal 43 is formed in substantially L-shaped. That is, each of these terminals is formed in a manner that a corresponding edge part of the bus bar 10 is extended and then bent to the circuit board 20 side located above. In each of the voltage detection terminals 41, 12 and the ground terminal 43, a tip side portion to the bent position is extended linearly and a tip area thereof penetrates the circuit board 20

The exterior case 60 is formed to cover a required portion of the bus bar 10. As shown in FIG. 9, the exterior case 60 has a concave space for assembling the circuit board 20 to the bus bar 10. In this embodiment, the concave space is set so as to face downward. Mold material is filled within the concave space of the exterior case 60 and thus a sealed part 50 is formed. Protection of elements, etc. mounted on the circuit board 20 is achieved by this sealed part 50. A connector 61 to be connected to the circuit board 20 can be attached to the exterior case 60 so that the voltage detection IC can communicate with an external device.

As the bent part 14 is provided at the bus bar 10 constituting the shunt resistance type current sensor 1, the through hole 12 for the wire harness W can be set at a position lower than the through hole 11 for the battery post 71. By doing so, the stud bolt 77 can be relatively lowered to the battery 70 side as compared with a case that the bus bar 10 is set in a flat shape entirely. Thus, a required space can be secured between a bonnet above the battery and the stud bolt 77. As a result, as an amount of deformation of the bonnet can be secured to be large with respect to load input, impact absorption characteristics with respect to load can be improved.

Further, in this embodiment, the bent part 14 is set between the through hole 11 for the battery post 71 and the shunt resistance part 13, and the circuit board 20 is disposed to oppose the upper surface side of the shunt resistance part 13.

In order to suppress the entire height of the shunt resistance type current sensor 1, the circuit board 20 is preferably disposed on the upper surface side of the bus bar 10 than the lower surface side thereof. In this respect, according to this embodiment, as the bent part 14 is positioned at the end of the shunt resistance part 13, sufficient disposal space for disposing the circuit board 20 can be secured on the upper surface side of the shunt resistance part 13. As a result, the circuit board 20 can be disposed on the upper surface side of the shunt resistance part 13 while avoiding interference between the bent part 14 and the circuit board 20.

Further, in this embodiment, the shunt resistance type current sensor 1 further includes the exterior case 60 which is formed in the bus bar 10 by the insert molding so as to have the concave space for assembling the circuit board 20 to the bus bar 10, and the sealed part 50 which is formed by filling the mold material within the concave space of the exterior case 60. The exterior case 60 is set so that the concave space faces upward.

According to such the configuration, the exterior case 60 can protect the circuit board 20. Further, although the exterior case 60 is set in a manner that the concave space housing the circuit board 20 therein faces upward, entering of liquid such as water can be suppressed by providing the sealed part 50.

As described above, although the shunt resistance type current sensor according to the embodiments is explained, the invention is not limited to these embodiments but can be changed in various manners within a range of the invention. For example, although the bent part is set so as to avoid the shunt resistance part in the aforesaid embodiments, it is sufficient that the bent part is set between the first connection part and the second connection part in a view point of lowering the relative position of the stud bolt.

Herein the features of the embodiments of the shunt resistance type current sensor according to the invention described above will be briefly summarized and listed below in [1] to [5].

[1] A shunt resistance type current sensor (1), includes:
a bus bar (10) which includes a first connection part (11) to be connected to a battery post (71), a second connection part (12) to be connected to a stud bolt (77) for fixing a wire harness, and a shunt resistance part (13) which is located between the first connection part (11) and the second connection part (12) and acts as a path of current to be measured;

a circuit board (20) which is disposed so as to oppose the bus bar (10);

a pair of terminals (voltage detection terminals 41, 42) each of which electrically connects between the bus bar (10) and the circuit board (20); and a voltage detector (voltage detection IC 30) which is mounted on the circuit board (20) and detects a magnitude of voltage applied between the pair of terminals (41, 42) in order to detect an amount of current to be measured flowing through the bus bar (10), wherein the bus bar (10) is configured so that an area including the second connection part (12) and an area including the first connection part (11) are formed in a stepped manner via a bent part (14), and the second connection part (12) is set at a position lower than the first connection part (11).

[2] The shunt resistance type current sensor (1) described in [1], wherein the bent part (14) is set between the shunt resistance part (13) and the second connection part (12), and the circuit board (20) is disposed so as to oppose a lower surface side of the shunt resistance part (13).

[3] The shunt resistance type current sensor (1) described in [2], further includes:

an exterior case (60) which is formed in the bus bar (10) by insert molding so as to have a concave space for assembling the circuit board (20) to the bus bar (10), and a sealed part (50) which is formed by filling mold material within the concave space of the exterior case (60), wherein the exterior case (60) is set so that the concave space faces downward.

[4] The shunt resistance type current sensor (1) described in [1], wherein the bent part (14) is set between the first connection part (11) and the shunt resistance part (13), and the circuit board (20) is disposed so as to oppose an upper surface side of the shunt resistance part (13).

[5] The shunt resistance type current sensor (1) described in [4], further includes:

an exterior case (60) which is formed in the bus bar (10) by insert molding so as to have a concave space for assembling the circuit board (20) to the bus bar (10), and a sealed part (50) which is formed by filling mold material within the concave space of the exterior case (60), wherein the exterior case (60) is set so that the concave space faces upward.

A detailed description has been given of the invention referring to the specific embodiments, but it will be understood by those skilled in the art that various changes and modifications can be made without departing from the spirit and scope of the invention.

According to the invention, the relative attachment position of the stud bolt disposed at the bus bar can be lowered, advantageously. The invention which produces this advantageous effect is useful in a shunt resistance type current sensor.

What is claimed is:

1. A shunt resistance type current sensor, comprising:
   a bus bar which includes a first connection part to be connected to a battery post which is an electrode of a battery, a second connection part to be connected to a stud bolt for fixing a wire harness, and a shunt resistance part which is located between the first connection part and the second connection part and acts as a path of current to be measured;
   a circuit board which is disposed so as to oppose the bus bar;
   a pair of terminals which electrically connect the bus bar and the circuit board; and
   a voltage detector which is mounted on the circuit board and detects a magnitude of voltage applied between the pair of terminals in order to detect an amount of current to be measured flowing through the bus bar, wherein
   the shunt resistance type current sensor is disposed on the battery, the bus bar is configured so that an area including the second connection part and an area including the first connection part are formed in a stepped manner via a bent part so as to relatively lower a position of the stud bolt toward the battery, and the second connection part is set at a position lower than an upper surface of the first connection part by a distance that is determined by a height of the bent part.

2. The shunt resistance type current sensor according to claim 1, wherein
   the bent part is set between the shunt resistance part and the second connection part, and
   the circuit board is disposed so as to oppose a lower surface side of the shunt resistance part.

3. The shunt resistance type current sensor according to claim 2, further comprising:
   an exterior case which is formed in the bus bar by insert molding so as to have a concave space for assembling the circuit board to the bus bar, and
   a sealed part which is formed by filling mold material within the concave space of the exterior case, wherein
   the exterior case is set so that the concave space faces downward.

4. The shunt resistance type current sensor according to claim 1, wherein
   the bent part is set between the first connection part and the shunt resistance part, and
   the circuit board is disposed so as to oppose an upper surface side of the shunt resistance part.

5. The shunt resistance type current sensor according to claim 4, further comprising:
   an exterior case which is formed in the bus bar by insert molding so as to have a concave space for assembling the circuit board to the bus bar, and
   a sealed part which is formed by filling mold material within the concave space of the exterior case, wherein
   the exterior case is set so that the concave space faces upward.

6. The shunt resistance type current sensor according to claim 1, wherein the circuit board is parallel with the upper surface of the first connection part.

7. The shunt resistance type current sensor according to claim 1, wherein the shunt resistance part overlaps with the first connection part.

8. The shunt resistance type current sensor according to claim 1, wherein the area including the second connection part and the area including the first connection part are formed in the stepped manner via a crank-shaped bent part.

9. The shunt resistance type current sensor according to claim 1, wherein the shunt resistance type current sensor is disposed substantially within an area of the battery in a top surface view.

10. The shunt resistance type current sensor according to claim 1, wherein an upper surface of the second connection part is set at a position lower than the upper surface of the first connection part in a direction that is perpendicular to the upper surface of the second connection part and the upper surface of the first connection part and that corresponds to an axial direction of the stud bolt.

* * * * *